(12) United States Patent
Ng

(10) Patent No.: US 8,040,039 B2
(45) Date of Patent: Oct. 18, 2011

(54) DEVICE AND METHOD FOR EMITTING COMPOSITE OUTPUT LIGHT USING MULTIPLE WAVELENGTH-CONVERSION MECHANISMS

(75) Inventor: Kee Yean Ng, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 1826 days.

(21) Appl. No.: 10/803,266

(22) Filed: Mar. 18, 2004

(65) Prior Publication Data

US 2005/0206301 A1    Sep. 22, 2005

(51) Int. Cl.
*H01J 1/62* (2006.01)
*H01J 63/04* (2006.01)

(52) U.S. Cl. ........ 313/501; 313/483; 313/498; 313/499; 313/500

(58) Field of Classification Search .................... 313/501
See application file for complete search history.

(56) References Cited

U.S. PATENT DOCUMENTS

| | | | |
|---|---|---|---|
| 6,337,536 B1 * | 1/2002 | Matsubara et al. | 313/498 |
| 6,509,651 B1 | 1/2003 | Matsubara et al. | |
| 6,858,869 B2 * | 2/2005 | Fujiwara | 257/79 |
| 2002/0043926 A1 * | 4/2002 | Takahashi et al. | 313/503 |
| 2005/0127833 A1 * | 6/2005 | Tieszen | 313/512 |

* cited by examiner

*Primary Examiner* — Natalie K Walford

(57) ABSTRACT

A device and method for emitting composite output light uses multiple wavelength-conversion mechanisms to convert the original light generated by a light source of the device into longer wavelength light to produce the composite output light. One of the wavelength-conversion mechanisms of the device is a fluorescent substrate of the light source that converts the original light into first converted light. Another wavelength-conversion mechanism of the device is a wavelength-conversion region optically coupled to the light source that converts the original light into second converted light. The original light, the first converted light and the second converted light are emitted from the device as components of the composite output light.

20 Claims, 3 Drawing Sheets

DEVICE AND METHOD FOR EMITTING COMPOSITE OUTPUT LIGHT USING MULTIPLE WAVELENGTH-CONVERSION MECHANISMS

BACKGROUND OF THE INVENTION

Conventional light sources, such as incandescent, halogen and fluorescent lamps, have not been significantly improved in the past twenty years. However, light emitting diode ("LEDs") have been improved to a point with respect to operating efficiency where LEDs are now replacing the conventional light sources in traditional monochrome lighting applications, such as traffic signal lights and automotive taillights. This is due in part to the fact that LEDs have many advantages over conventional light sources. These advantages include longer operating life, lower power consumption, and smaller size.

LEDs are typically monochromatic semiconductor light sources, and are currently available in various colors from UV-blue to green, yellow and red. Due to the narrow-band emission characteristics, monochromatic LEDs cannot be directly used for "white" light applications. Rather, the output light of a monochromatic LED must be mixed with other light of one or more different wavelengths to produce white composite light. Some conventional LEDs include a wavelength-conversion mechanism to convert some of the original light generated by the LEDs into longer different wavelength light, which combines with the original light to produce white composite light. One such type of LEDs of interest uses an LED die with a fluorescent substrate as the wavelength-conversion mechanism to convert the light emitted from an active layer of the LED die into longer wavelength light. As an example, the active layer of the LED die may be Gallium Indium Nitride (GaInN) active layer that emits light having a peak wavelength of approximately 430 nm, and the fluorescent substrate of the LED die may be a Gallium Nitride (GaN) substrate doped with oxygen, carbon or nitrogen vacancy that converts some of the light emitted from the GaN active layer into light having a peak wavelength of approximately 550 nm.

A concern with the conventional LEDs that use a fluorescent substrate as a wavelength-conversion mechanism is that the resulting white composite light from the LEDs may be deficient in certain wavelengths, e.g., in the red wavelength range of the visible spectrum (~620 nm to ~800 nm). As such, these LEDs do not have high color rendering characteristics.

Another concern is that since the original light and the converted light originate from different locations within an LED die, the original light and the converted light may not blend together well, resulting in a composite light that has a non-homogeneous color. As an example, the composite output light from the central portion of the LED may appear bluer than the light from the perimeter of the LED.

In view of these concerns, there is a need for an LED and method for emitting white composite light with high color rendering characteristics and more homogeneous color.

SUMMARY OF THE INVENTION

A device and method for emitting composite output light uses multiple wavelength-conversion mechanisms to convert the original light generated by a light source of the device into longer wavelength light to produce the composite output light. One of the wavelength-conversion mechanisms of the device is a fluorescent substrate of the light source that converts the original light into first converted light. Another wavelength-conversion mechanism of the device is a wavelength-conversion region optically coupled to the light source that converts the original light into second converted light. The original light, the first converted light and the second converted light are emitted from the device as components of the composite output light.

A device for emitting composite output light in accordance with an embodiment of the invention includes a light source and a wavelength-conversion region. The light source emits original light. The light source includes a fluorescent layer having a property to convert some of the original light into first converted light. The wavelength-conversion region is optically coupled to the light source to receive some of the original light and the first converted light. The wavelength-conversion region includes a fluorescent material having a property to convert some of the original light into second converted light. The original light, the first converted light and the second converted light are components of the composite output light.

A method for emitting composite output light includes generating original light within a light source, converting some of the original light into first converted light within the light source, converting some of the original light into second converted light outside of the light source, and emitting the original light, the first converted light and the second converted light as components of the composite output light.

Other aspects and advantages of the present invention will become apparent from the following detailed description, taken in conjunction with the accompanying drawings, illustrated by way of example of the principles of the invention.

DETAILED DESCRIPTION

Figure 1:
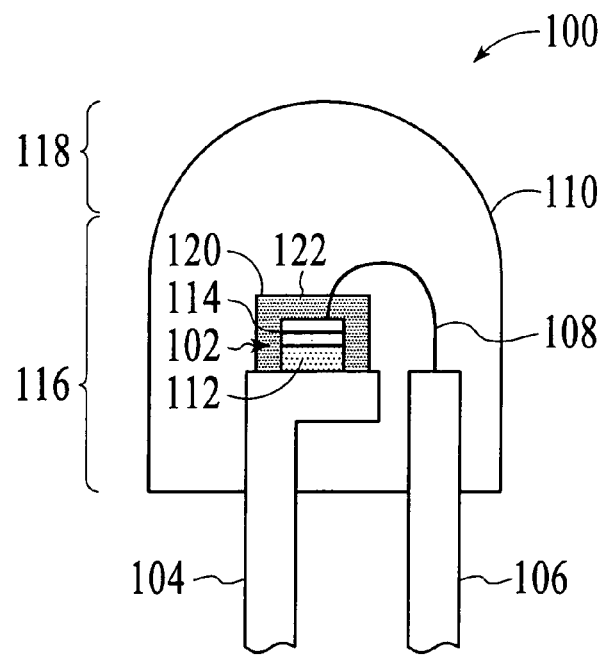
FIG. 1 is a diagram of a light emitting diode (LED) having two wavelength-conversion mechanisms in accordance with an embodiment of the invention.

With reference to FIG. 1, a light emitting diode (LED) 100 in accordance with an embodiment of the invention is shown. The LED 100 is designed to produce composite output light using multiple wavelength-conversion mechanisms. As an example, the composite output light produced by the LED 100 may be "white" output light. The white output light is produced by converting some of the original light generated by the LED 100 into longer wavelength light using the wavelength-conversion mechanisms. The use of multiple wavelength-conversion mechanisms can produce composite output light having a more homogeneous color and/or higher color rendering characteristics than conventional LEDs that use only a single wavelength-conversion mechanism, e.g., a fluorescent substrate.

As shown in FIG. 1, the LED 100 is a leadframe-mounted LED. The LED 100 includes an LED die 102, leadframes 104 and 106, a wire 108 and a lamp 110. The LED die 102 is a semiconductor chip that functions as a light source for the LED 100. The LED die 102 includes a fluorescent substrate 112 and a number of layers formed over the fluorescent substrate, including an active layer 114. The active layer 114 is the layer of the LED die 102 from which light is generated. This light is sometimes referred to herein as the original light or the original emitted light. The wavelength of the original light emitted from the active layer 114 depends primarily on the materials used to form the LED die 102. As an example, the LED die 102 may be configured such that the active layer 114 generates blue light (peak wavelength of approximately 430 nm), which can be converted into lower energy (longer wavelength) light using fluorescence. The other layers formed over the fluorescent substrate 112 are those commonly found in LEDs, such as buffer layers, cladding layers and contact layers. As such, these layers are not described herein in detail.

The fluorescent substrate 112 of the LED die 102 is the first wavelength-conversion mechanism included in the LED 102. The fluorescent substrate 112 converts some of the original light emitted from the active layer 114 of the LED die 102 into longer wavelength light. The fluorescent substrate 112 may be a semiconductor or insulating substrate that has been doped with one or more impurities. As an example, the fluorescent substrate 112 may be a Gallium Nitride (GaN) substrate doped with oxygen, carbon or nitrogen vacancy. However, the fluorescent substrate 112 can be any substrate that has a fluorescent property to convert the original light emitted from the active layer 114 into longer wavelength light.

The LED die 102 is situated on the leadframe 104. In the illustrated embodiment, the top surface of the leadframe 104 on which the LED die 102 is positioned is a planar surface. However, in another embodiment, the top surface of the leadframe 104 includes a reflector cup (not shown), or a reflective depressed region, in which the LED die 102 is positioned. The LED die 102 is electrically connected to the other leadframe 106 via the wire 108. In this illustrated embodiment, the fluorescent substrate 112 of the LED die 102 is electrically connected to the leadframe 104. In another embodiment, the LED die 102 is electrically connected to the leadframe 104 via a second wire (not shown). The use of the second wire is dependent on the type of LED die 102. The leadframes 104 and 106 provide the electrical power needed to drive the LED die 102. The LED die 102 is encapsulated in the lamp 110, which is a medium for the propagation of light from the LED die 102. The lamp 110 includes a main section 116 and an output section 118. In this embodiment, the output section 118 of the lamp 110 is dome-shaped to function as a lens. Thus, the light emitted from the LED 100 as output light is focused by the dome-shaped output section 118 of the lamp 110. However, in other embodiments, the output section 118 of the lamp 100 may be horizontally planar.

The lamp 110 of the LED 100 is made of a transparent substance, which can be any transparent material such as clear epoxy, so that light from the LED die 102 can travel through the lamp and be emitted out of the output section 118 of the lamp. As shown in FIG. 1, the lamp 110 includes a wavelength-conversion region 120, which is also a medium for propagating light. That is, light from the LED die 102 is able to travel through the wavelength-conversion region 120. The wavelength-conversion region 120 includes fluorescent material 122, which has a property to convert some of the original light emitted by the LED die 102 into lower energy (longer wavelength) light. The fluorescent material 122 in the region 120 absorbs some of the original light from the LED die 102, which excites the atoms of the fluorescent material, and emits the longer wavelength light. The wavelength-conversion region 120 is the second wavelength-conversion mechanism included in the LED 100.

As illustrated in FIG. 1, the wavelength-conversion region 120 surrounds the LED die 102. Consequently, the wavelength-conversion region 120 encloses the LED die 102 over the top surface of the leadframe 104. Thus, in this embodiment, the light from the LED die 102, whether the light is the original light from the active layer 114 of the LED die or the converted light from the fluorescent substrate 112, propagates through the wavelength-conversion region 120 to be emitted from the LED 100 as output light. Although the wavelength-conversion region 120 is shown in FIG. 1 as having a uniform thickness, the wavelength-conversion region may have an irregular or varying thickness.

In the illustrated embodiment, the fluorescent material 122 included in the wavelength-conversion region 120 includes one or more inorganic phosphors or nano-phosphors in the form of particulates. The typical size of inorganic phosphor particulates range from 1 to 50 micrometers, while the typical size of nano-phosphor particulates range from 1 to 100 nanometers. As an example, the fluorescent material 122 used in the wavelength-conversion region 120 may be Europium activated Strontium Sulfide (SrS), which converts the original light (e.g., blue light) into red light (i.e., peak wavelength in the red region of the optical spectrum), Europium activated Strontium Thiogallate (SrTG:Eu), which converts the original light into green light (i.e., peak wavelength in the green region of the optical spectrum) and/or Cerium activated Yttrium Aluminum Garnet (YAG:Ce), which converts the original light into yellow light (i.e., peak wavelength in the yellow region of the optical spectrum). However, any phosphor or combination of phosphors can be used, including nano-phosphors, as long as the phosphors are activated by the original light emitted from the active layer 114 of the LED die 102.

In an alternative embodiment, the fluorescent material 122 of the wavelength-conversion region 120 includes one or more fluorescent organic dyes or any combination of fluorescent organic dyes, inorganic phosphors and nano-phosphors. The type of fluorescent material 122 included in the wavelength-conversion region 120 can be selected to enhance or supplement color components of the composite output light of the LED 100. Thus, the fluorescent material 122 of the wavelength-conversion region 120 may convert the original emitted light from the active layer 114 of the LED die 102 into light having a peak wavelength that differs from the peak wavelength of the light converted by the fluorescent substrate 112. In other words, the fluorescent material 122 of the wavelength-conversion region 120 may be selected to convert the original emitted light from the active layer 114 of the LED die 102 into light having a peak wavelength near a region of the visible light spectrum that is deficient when only the original light and the converted light from the fluorescent substrate 112 of the LED die 102 are combined to produce a composite light. However, the fluorescent material 122 of the wavelength-conversion region 120 may be selected to convert the original emitted light from the active layer 114 of the LED die 102 into light having the same or substantially same peak wavelength as the converted light from the fluorescent substrate 112.

The lamp 110 with the wavelength-conversion region 120 can be fabricated using a variety of methods. In one embodiment, the fluorescent material 122 is mixed with epoxy and then placed over the LED die 102, forming the wavelength-conversion region 120. In another embodiment, the fluorescent material 122 is mixed with molding compound, e.g., clear plastic compound, and is transfer molded over the LED die 102, forming the wavelength-conversion region 120. In either embodiment, the rest of the lamp 110 can be formed over the LED die 102 and the wavelength-conversion region 120 using a conventional method, such as transfer molding or casting.

Figure 2:
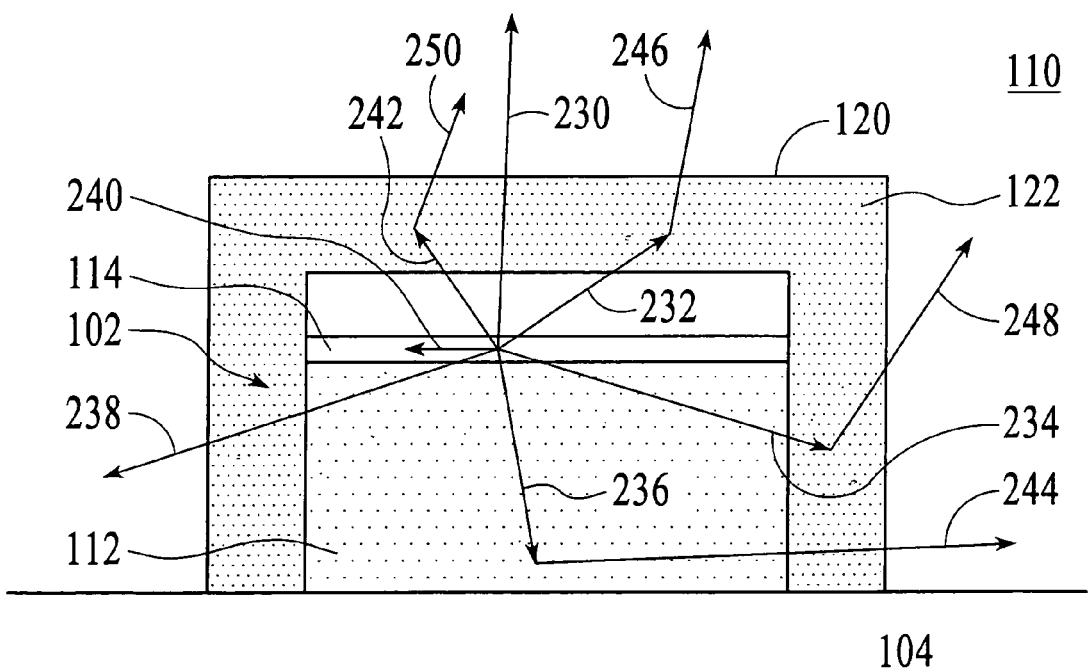
FIG. 2 shows light from different regions of the LED of FIG. 1, including converted light from the fluorescent substrate and the wavelength-conversion region of the LED.

In operation, the LED 102 generates composite output light using both the fluorescent substrate 112 of the LED die 102 and the wavelength-conversion region 120 of the lamp 110 as two distinct wavelength-conversion mechanisms. When the LED 100 is activated, i.e., current is injected into the LED die 102 through the leadframes 104 and 106, original light is emitted from the active layer 114 of the LED die in all directions, as illustrated by the light on paths 230, 232, 234, 236, 238, 240 and 242 in FIG. 2. The original light has a spectrum peak at a first wavelength, e.g., at 430 nm. Some of the original light emitted downward into the fluorescent substrate 112 is converted into longer wavelength light by the fluorescent substrate, as illustrated by the light on path 244. This converted light has a spectrum peak at a second wavelength, e.g., at 550 nm. However, some of the original light emitted into the fluorescent substrate 112 propagates through the fluorescent substrate without being converted into longer wavelength light, as illustrated by the light on paths 234 and 238. Thus, some of the light emitted out of the fluorescent substrate 112 is the original light from the active layer 114 of the LED die 102.

The remaining original light from the active layer 114 of the LED die 102 is emitted out of the LED die without propagating through the fluorescent substrate 112, as illustrated by the light on paths 230, 232, 240 and 242. In this embodiment, since the LED die 102 is covered by the wavelength-conversion region 120 of the lamp 110 over the leadframe 104, the original light emitted out of the LED die that has or has not propagated through the fluorescent substrate 112 travels into the wavelength-conversion region. Some of this original light is then converted into longer wavelength light by the fluorescent material 122 of the wavelength-conversion region 120, as illustrated by the light on paths 246, 248 and 250. This converted light has a spectrum peak at a third wavelength, e.g., at 650 nm. Thus, light emitted out of the wavelength-conversion region 120 includes the original light, as illustrated by the light on path 230 and 238, and the converted light from the wavelength-conversion region 120, as illustrated by the light on paths 246, 248 and 250, as well as the converted light from the fluorescent substrate 112 of the LED die 102, as illustrated by the light on path 244. Consequently, the original light from the active layer 114, the converted light from the fluorescent substrate 112 of the LED die and the converted light from the wavelength-conversion region 120 of the lamp 110 are emitted as components of the composite output light of the LED 100.

Due to the converted light from the wavelength-conversion region 120, which in one embodiment has a peak wavelength that differs from the peak wavelength of the original light emitted from the active layer 114 of the LED die 102 and the peak wavelength of the converted light from the fluorescent substrate 112 of the LED die, the composite output light of the LED 100 may have a broader spectrum than the composite output light of a conventional LED that uses a fluorescent substrate as the only wavelength-conversion mechanism. Furthermore, if phosphor particulates are used in the wavelength-conversion region 120 as the fluorescent material 122, then the phosphor particulates also function to scatter the original light and the converted light from by the fluorescent substrate 112 to better blend or mix the original light and the converted light so that the composite output light of the LED 100 has a more homogeneous color.

Figure 3A:
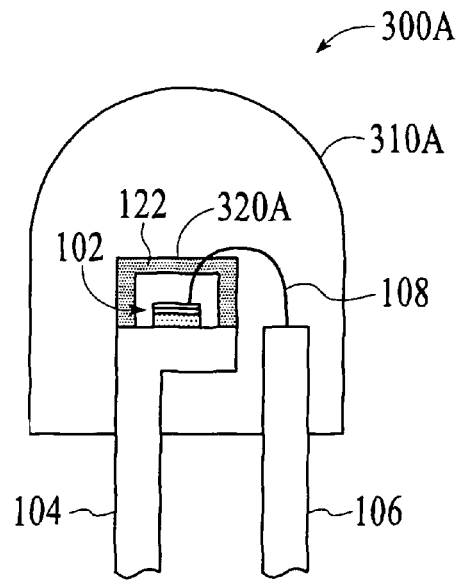
FIGS. 3A and 3B are diagrams of LEDs with alternative wavelength-conversion region configurations in accordance with an embodiment of the invention.
Figure 3B:
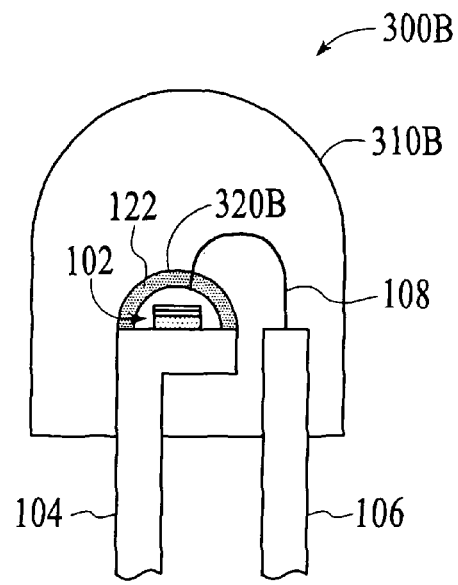

Turning now to FIGS. 3A and 3B, LEDs 300A and 300B with alternative wavelength-conversion region configurations in accordance with an embodiment of the invention are shown. In these figures, same reference numerals of FIG. 1 are used to identify similar elements. The LED 300A of FIG. 3A includes a lamp 310A in which a wavelength-conversion region 320A is located between the LED die 102 and the outer surface of the lamp. The wavelength-conversion region 320A has a configuration of a square or rectangular box positioned on the top surface of the leadframe 104 over the LED die 102. Thus, the wavelength-conversion region 320A is configured to substantially enclose the LED die 102 over the leadframe 104. The LED 300B of FIG. 3B includes a lamp 310B in which a wavelength-conversion region 320B is also located between the LED die 102 and the outer surface of the lamp. However, the wavelength-conversion region 320B of the LED 300B has a configuration of a hemispheric shell positioned on the top surface of the leadframe 104 over the LED die 102. Thus, the wavelength-conversion region 320B is also configured to substantially enclose the LED die 102 over the leadframe 104. The lamps 310A and 310B with the wavelength-conversion regions 320A and 320B, respectively, can be fabricated by any practical combination of depositing epoxy with or without the fluorescent material 122 over the LED die 102 and transfer molding a mold compound or casting an epoxy with or without fluorescent material 122 over the LED die.

Figure 4A:
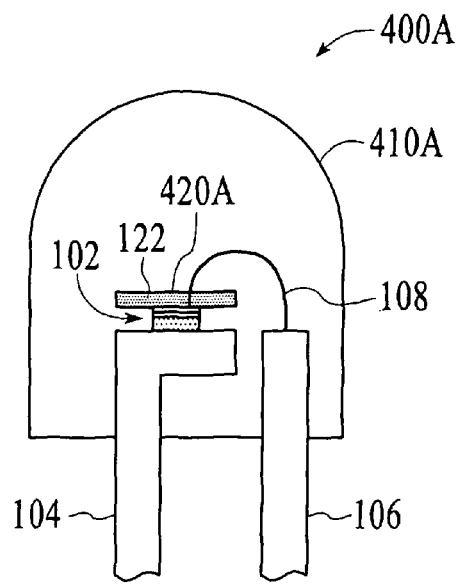
FIGS. 4A and 4B are diagrams of LEDs with a planar wavelength-conversion region in accordance with an alternative embodiment of the invention.
Figure 4B:
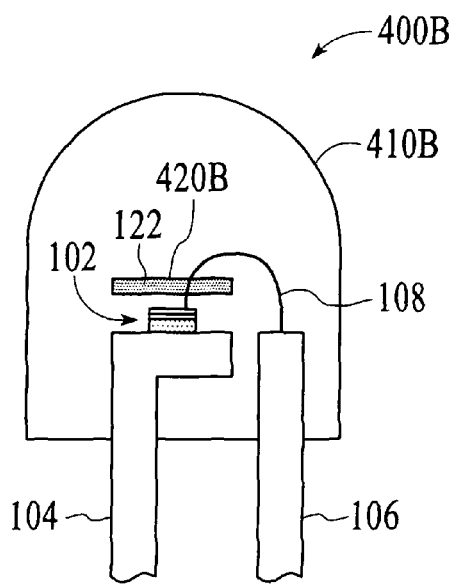

Turning now to FIGS. 4A and 4B, LEDs 400A and 400B with a planar wavelength-conversion region in accordance with an alternative embodiment of the invention are shown. The LED 400A of FIG. 4A includes a lamp 410A in which a wavelength-conversion region 420A is a planar layer positioned on the LED die 102. The size of the fluorescent layer 420A may be the same as the LED die 102 or larger, as illustrate in FIG. 4A. The LED 400B of FIG. 4B includes a lamp 410B in which a wavelength-conversion region 420B is a planar layer positioned over the LED die 102, but not on the LED die. Thus, there is a region of transparent material between the LED die 102 and the fluorescent layer 420B. Similar to the fluorescent layer 420A of the LED 400A, the size of the fluorescent layer 420B may be the same as the LED die or larger. The lamps 410A and 410B with the wavelength-conversion regions 420A and 420B, respectively, can also be fabricated by any practical combination of depositing epoxy with or without the fluorescent material 122 over the LED die 102 and transfer molding a mold compound or casting an epoxy with or without fluorescent material 122 over the LED die.

The different wavelength-conversion region configurations described above can be applied to other types of LED devices, such as surface-mounted LED devices, to produce other types of LED devices with multiple wavelength-conversion mechanisms in accordance with the invention. In addition, these different wavelength-conversion region configurations may be applied to other types of light emitting devices, such as semiconductor lasing devices, to produce other types of light emitting device in accordance with the invention.

Figure 5:
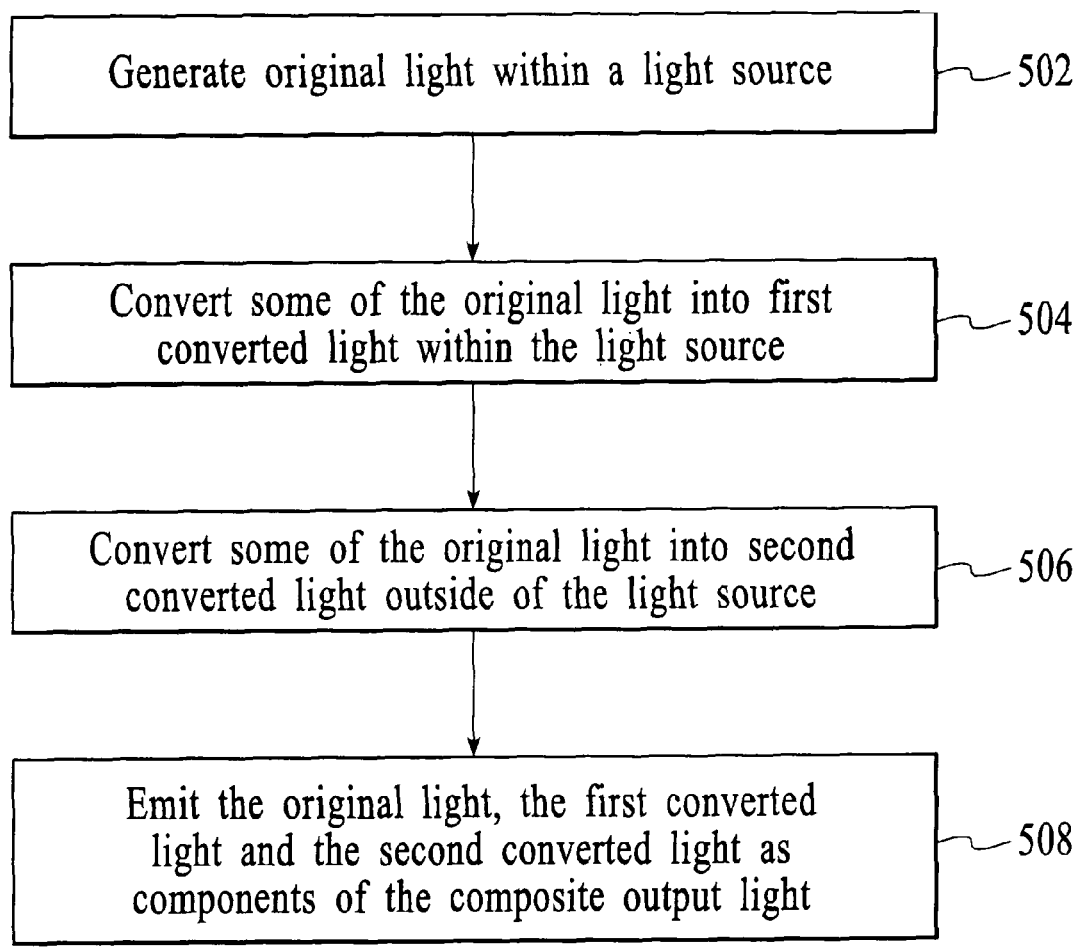
FIG. 5 is a flow diagram of a method for emitting composite output light in accordance with an embodiment of the invention.

A method for emitting composite output light in accordance with an embodiment of the invention is described with reference to a flow diagram of FIG. 5. At block 502, original light is generated within a light source, which may be an LED die. Next, at block 504, some of the original light is converted into first converted light within the light source, e.g., by a fluorescent substrate of the light source. Next, at block 506, some of the original light is converted into second converted light outside of the light source, e.g., by a fluorescent region optically coupled to the light source. Next, at block 508, the original light, the first converted light and the second converted light are emitted as the components of the composite output light.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A device for emitting composite output light, said device comprising:
   a light source that emits original light, the light source including a fluorescent layer having a property to convert some of said original light into first converted light, wherein said fluorescent layer is a substrate of said light source, said substrate being doped with one or more impurities to have a fluorescent property; and
   a wavelength-conversion region optically coupled to said light source to receive some of said original light and said first converted light, said wavelength-conversion region including a fluorescent material having a property to convert some of said original light into second converted light, said original light, said first light and said second converted light being components of said composite output light.

2. The device of claim 1 wherein said light source is a light emitting diode die.

3. The device of claim 1 wherein said fluorescent material of said wavelength-conversion region includes at least one of fluorescent organic dye, inorganic phosphor and nano-phosphor.

4. The device of claim 1 wherein said fluorescent material of said wavelength-conversion region includes fluorescent particulates to scatter said original light and said first converted light that propagate through said wavelength-conversion region.

5. The device of claim 1 wherein said wavelength-conversion region is configured to substantially enclose said light source over a surface on which said light source is positioned.

6. The device of claim 5 wherein said wavelength-conversion region is positioned on said light source such that said light source is covered by said wavelength-conversion region.

7. The device of claim 1 wherein said wavelength-conversion region is configured as a planar layer positioned over said light source.

8. A method for emitting composite output light, said method comprising:
   generating original light within a light source;
   converting some of said original light into first converted light at a fluorescent substrate of said light source, said fluorescent substrate being doped with one or more impurities to have a fluorescent property;
   converting some of said original light into second converted light outside of said light source; and
   emitting said original light, said first converted light and said second converted light as components of said composite output light.

9. The method of claim 8 wherein said generating of said original light includes generating said original light within an active layer of a light emitting diode die.

10. The method of claim 9 wherein said converting of said original light into said first converted light includes converting said original light into said first converted light at said fluorescent substrate of said light emitting diode die.

11. The method of claim 8 wherein said converting of said original light into said second converted light includes converting said original light into said second converted light at a wavelength-conversion region optically coupled to said light source.

12. The method of claim 11 wherein said converting of said original light into said second converted light includes converting said original light into said second converted light using fluorescence.

13. The method of claim 12 wherein said converting of said original light into said second converted light includes scattering said original light and said first converted light propagating through said wavelength-conversion region.

14. A device for emitting composite output light, said device comprising:
   a semiconductor die that emits first light of a first peak wavelength, said semiconductor die including a fluorescent substrate having a property to convert some of the first light into second light of a second peak wavelength, said fluorescent substrate being doped with one or more impurities to have a fluorescent property; and
   a wavelength-conversion region positioned to receive at least some of said first light and said second light, said wavelength-conversion region having a property to convert some of said first light into third light of a third peak wavelength, said first light, said second light and said third light being components of said composite output light.

15. The device of claim 14 wherein said semiconductor die is a light emitting diode die.

16. The device of claim 14 wherein said wavelength-conversion region includes at least one of fluorescent organic dye, inorganic phosphor and nano-phosphor.

17. The device of claim 14 wherein said wavelength-conversion region includes fluorescent particulates to scatter said first light and said second light that propagate through said wavelength-conversion region.

18. The device of claim 14 wherein said wavelength-conversion region is configured to substantially enclose said semiconductor die over a surface on which said semiconductor die is positioned.

19. The device of claim 18 wherein said wavelength-conversion region is positioned on said semiconductor die such that said semiconductor die is covered by said wavelength-conversion region.

20. The device of claim 14 wherein said wavelength-conversion region is configured as a planar layer positioned over said semiconductor die.

* * * * *